(12) United States Patent
Lai

(10) Patent No.: US 9,985,045 B2
(45) Date of Patent: May 29, 2018

(54) SEMICONDUCTOR STRUCTURE

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days. days.

(21) Appl. No.: 15/837,109

(22) Filed: Dec. 11, 2017

(65) Prior Publication Data

US 2018/0102370 A1    Apr. 12, 2018

Related U.S. Application Data

(62) Division of application No. 14/979,863, filed on Dec. 28, 2015, now Pat. No. 9,876,023.

(51) Int. Cl.
| | |
|---|---|
| H01L 27/1157 | (2017.01) |
| H01L 21/28 | (2006.01) |
| H01L 21/033 | (2006.01) |
| H01L 27/11582 | (2017.01) |

(52) U.S. Cl.
CPC ...... *H01L 27/1157* (2013.01); *H01L 21/0332* (2013.01); *H01L 21/28282* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 8,084,819 B2 * | 12/2011 | Kim | ............... | H01L 27/11582 257/347 |
| 9,368,509 B2 * | 6/2016 | Pang | ............... | H01L 27/11556 |
| 9,443,866 B1 * | 9/2016 | Sakakibara | ....... | H01L 27/11582 |
| 2008/0173928 A1 * | 7/2008 | Arai | ................. | H01L 27/11556 257/316 |
| 2012/0193700 A1 * | 8/2012 | Kim | ................. | H01L 27/11565 257/324 |
| 2012/0231593 A1 * | 9/2012 | Joo | ................. | H01L 27/11556 438/264 |
| 2015/0194435 A1 | 7/2015 | Lee | | |

OTHER PUBLICATIONS

TIPO Office Action dated Feb. 2, 2017 in Taiwan application (No. 104143469).

Ahn, et al.: "A New Metal Control Gate Last Process (MCGL process) for High Performance DC-SF (Dual Control gate with Surrounding Floating gate) 3D NAND Flash Memory"; 2012 Symposium on VLSI Technology Digest of Technical Papers; pp. 19-20.

* cited by examiner

*Primary Examiner* — Ali Naraghi

(74) *Attorney, Agent, or Firm* — McClure, Qualey & Rodack, LLP

(57) ABSTRACT

A semiconductor structure and a method of manufacturing the same are provided. The semiconductor structure includes a stack including first conductive layers and first dielectric layers, a second conductive layer formed on the stack, openings through the second conductive layer and the stack, and through structures formed in the openings, respectively. Each through structure includes a memory layer, a gate dielectric layer, a channel layer, a dielectric material and a pad. The channel layer is isolated from the stack by the memory layer, the channel layer is isolated from the second conductive layer by the gate dielectric layer, and the memory layer and the gate dielectric layer have different compositions.

8 Claims, 24 Drawing Sheets

SEMICONDUCTOR STRUCTURE

This application is a divisional application of U.S. application Ser. No. 14/979,863, filed on Dec. 28, 2015. The entire content of which is incorporated herein by reference.

TECHNICAL FIELD

This disclosure relates to a semiconductor structure and a method of manufacturing the same. More particularly, this disclosure relates to a semiconductor structure in which different isolation means are provided for a channel layer, and a method of manufacturing the same.

BACKGROUND

Semiconductor devices have become denser and smaller. 3D memories, going with the trend, have been developed. In a typical 3D memory semiconductor device, the structure used as the memory layer may also be used to provide the gate dielectric layer for the string select line. As such, during the program/erase of the memory cells, the gate dielectric layer for the string select line may also be charged. Thus, an extra circuitry is needed to control program/erase of the gate dielectric layer for the string select line.

SUMMARY

In this disclosure, two isolation means are provided. As such, the problem described above can be solved.

According to some embodiments, a semiconductor structure is provided. The semiconductor structure comprises a substrate and a stack formed on the substrate. The stack comprises a plurality of first conductive layers and a plurality of first dielectric layers, and the first conductive layers and the first dielectric layers are alternately stacked. The semiconductor structure further comprises a second conductive layer formed on the stack. The semiconductor structure further comprises a plurality of openings through the second conductive layer and the stack. The semiconductor structure further comprises a plurality of through structures formed in the openings, respectively. Each of the through structures comprises a memory layer, a gate dielectric layer, a channel layer, a dielectric material and a pad. The memory layer and the gate dielectric layer are formed on a sidewall of each of the openings. The channel layer is formed on the memory layer and the gate dielectric layer. The channel layer defines a space. The dielectric material and the pad are formed in the space defined by the channel layer, wherein the pad is above the dielectric material. The channel layer is isolated from the stack by the memory layer, the channel layer is isolated from the second conductive layer by the gate dielectric layer, and the memory layer and the gate dielectric layer have different compositions.

According to some embodiments, a method of manufacturing a semiconductor structure is provided. The method comprises following steps. A stack is formed on a substrate, wherein the stack comprises a plurality of first layers and a plurality of second layers, and the first layers and the second layers are alternately stacked. A hard mask is formed on the stack. A plurality of openings are formed through the hard mask and the stack. A plurality of memory layers are formed on sidewalls of the openings, respectively. A plurality of channel layers are formed on the memory layers, respectively. A dielectric material is filled into the openings. A plurality of pads are formed on the dielectric material in the openings, respectively. The hard mask is removed. Portions of the memory layers that extend beyond the stack are removed. A plurality of gate dielectric layers are formed on the channel layers. A second conductive layer is formed on the stack. The channel layers are isolated from the stack by the memory layers, the channel layers are isolated from the second conductive layer by the gate dielectric layers, and the memory layers and the gate dielectric layers have different compositions.

Figure 1:
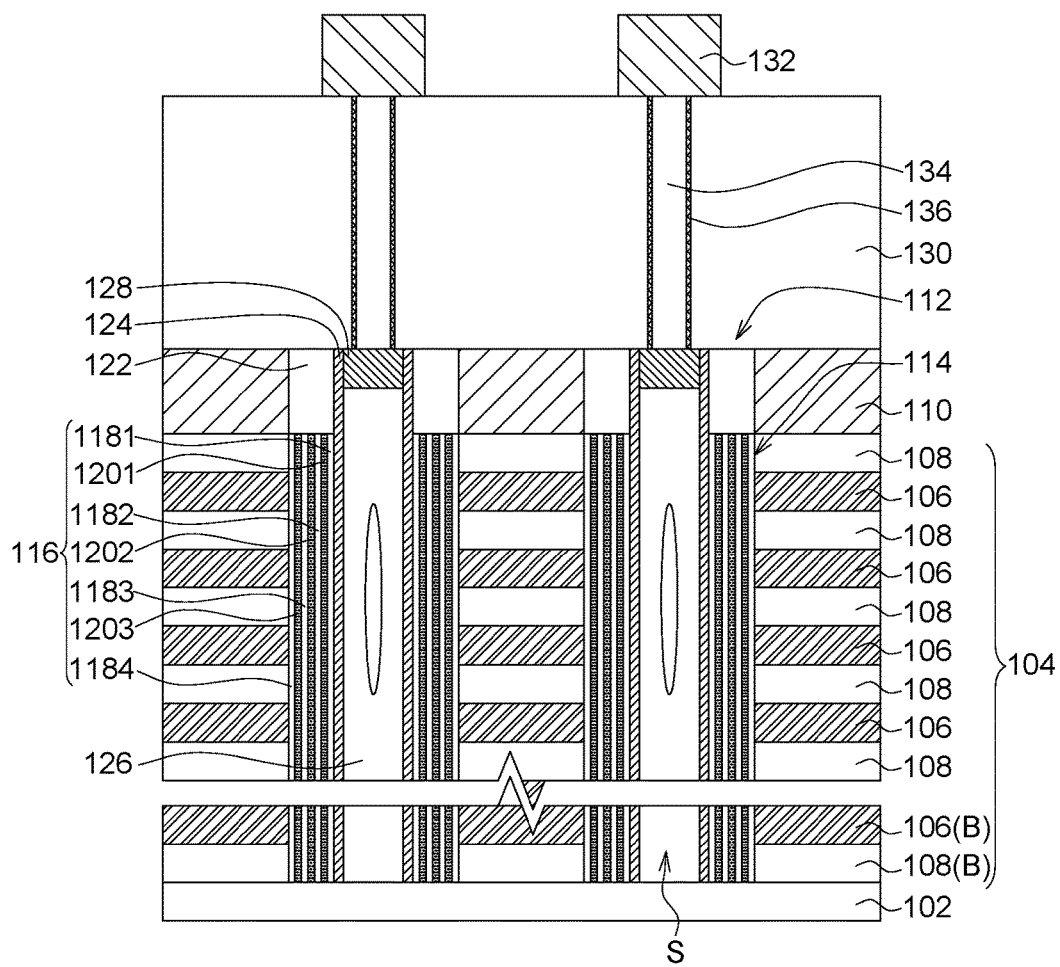
FIG. 1 shows a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, 3D vertical channel NAND memory structures are exemplarily illustrated. However, the semiconductor structures according to embodiments are not limited thereto.

It is noted that, for clarity, the elements in the figures may not reflect their real sizes. In addition, some elements that will not be discussed in detail may be omitted in some figures.

It is noted that the expression used herein is for the purpose of describing exemplary embodiments only and is not intended to be limiting of the present invention. For example, the singular forms "a," "an" and "the" are intended to include the plural forms as well, unless the context clearly indicates otherwise. Further, the steps comprised in a method are not necessarily conducted in a particular sequence. One step, while possible, may be conducted prior to, simultaneously with, or after another step.

It is contemplated that elements and features of one embodiment may be beneficially incorporated in other embodiments without further recitation.

Referring to FIG. 1, a semiconductor structure according to embodiments is provided. The semiconductor structure comprises a substrate 102 and a stack 104 formed on the substrate 102. The stack 104 comprises a plurality of first conductive layers 106 and a plurality of first dielectric layers 108, and the first conductive layers 106 and the first dielectric layers 108 are alternately stacked. The first conductive layers 106 may be formed of heavily doped p-type polysilicon, metal, or the like. The first dielectric layers 108 may be formed of oxide. The semiconductor structure further comprises a second conductive layer 110 formed on the stack 104. The second conductive layer 110 may be formed of heavily doped p-type or n-type polysilicon, and typically be formed of heavily doped n-type polysilicon. The semiconductor structure further comprises a plurality of openings 112 through the second conductive layer 110 and the stack 104. The semiconductor structure further comprises a plurality of through structures 114 formed in the openings 112, respectively.

Each of the through structures 114 comprises a memory layer 116, a gate dielectric layer 122, a channel layer 124, a dielectric material 126 and a pad 128. The memory layer 116 and the gate dielectric layer 122 are formed on a sidewall of each of the openings 112. In some embodiments, the gate dielectric layer 122 is above the memory layer 116. The memory layer 116 and the gate dielectric layer 122 have different compositions. For example, the memory layer 116 may have an oxide/nitride/oxide (ONO) structure, an oxide/nitride/oxide/nitride/oxide (ONONO) structure, an oxide/nitride/oxide/nitride/oxide/nitride/oxide (ONONONO) structure, a SiON/SiN/oxide structure, or any one of other suitable tunneling-trapping-blocking structures. In FIG. 1, the memory layer 116 is illustrated having an ONONONO structure. That is, the memory layer 116 comprises oxide layers 1181-1184 and nitride layers 1201-1203, wherein the oxide layer 1181, the nitride layer 1201 and the oxide layer 1182 constitute the tunneling structure, the nitride layer 1202 constitute the trapping structure, and the oxide layer 1183, the nitride layer 1203 and the oxide layer 1184 constitute the blocking structure. The gate dielectric layer 122 may be a layer formed of oxide. The channel layer 124 is formed on the memory layer 116 and the gate dielectric layer 122. The channel layer 124 may be formed of undoped polysilicon. The channel layer 124 defines a space S, i.e., the remaining space of the opening 112. The dielectric material 126 and the pad 128 are formed in the space S defined by the channel layer 124, wherein the pad 128 is above the dielectric material 126. In some embodiments, a top surface of the dielectric material 126 is at a level higher than a top surface of the stack 104. The dielectric material 126 may be oxide. The pad 128 may be formed of heavily doped n-type polysilicon. The channel layer 124 is isolated (either spatially or electrically) from the stack 104 by the memory layer 116, and the channel layer 124 is isolated from the second conductive layer 110 by the gate dielectric layer 122. In some embodiments, the channel layer 124 is isolated from the second conductive layer 110 by only the gate dielectric layer 122.

According to some embodiments, the bottom first dielectric layer 108(B) may be a buried oxide layer, the bottom first conductive layer 106(B) may comprise a ground select line, and the other first conductive layers 106 may comprise word lines. For a memory structure, the memory cells are defined at cross-points of the word lines and the channel layers. Further, the second conductive layer 110 may comprise a string select line, and the channel layer 124 of at least one of the through structures 114 is isolated from the string select line by the gate dielectric layer 122 of the at least one of the through structures 114.

In some embodiments, such as those applied to gate all-around (GAA) memory structures, the openings 112 are holes. In such cases, the whole bottom first conductive layer 106(B) may be used as a ground select line, each of the other first conductive layers 106 may be used as a word line, and the whole second conductive layer 110 may be used as a string select line.

In some embodiments, such as those applied to single gate vertical channel (SGVC) memory structures, the openings 112 are trenches. Both the stack 104 and the second conductive layer 110 may be dived into a plurality of parallel portions by the trenches. In such cases, the bottom first conductive layer 106(B) comprises a plurality of ground select lines, each of the other first conductive layers 106 comprises a plurality of word lines, and the second conductive layer 110 comprises a plurality of string select lines.

The semiconductor structure may further comprise a second dielectric layer 130, a third conductive layer 132, connectors 134 and other typical elements (not shown). The second dielectric layer 130 is formed on the second conductive layer 110. The second dielectric layer 130 may be formed of oxide. The third conductive layer 132 is formed on the second dielectric layer 130. The third conductive layer 132 may be formed of metal. The third conductive layer 132 may comprise a plurality of bit lines. Each of the connectors 134 connects each of the bit lines to the corresponding pad 128. Each of the connectors 134 may comprise a liner 136 to compensate an overlay shift during the manufacturing process.

Figure 2:
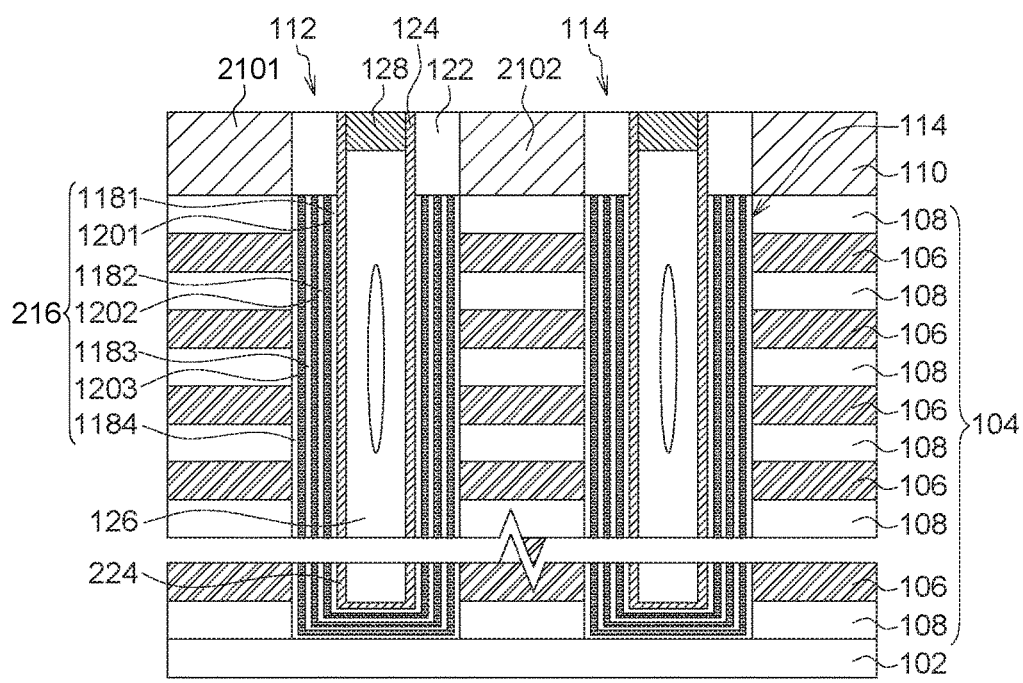
FIG. 2 shows another semiconductor structure according to embodiments.

Referring to FIG. 2, another semiconductor structure according to embodiments is provided. In the semiconductor structure shown in FIG. 2, the openings 112 are trenches, and both the stack 104 and the second conductive layer 110 are dived into a plurality of parallel portions by the trenches. In the semiconductor structure shown in FIG. 2, the memory layer 216 and the channel layer 224 in one trench form a U-shape, and the second conductive layer 110 comprises a string select line 2101 and a ground select line 2102 at two sides of the trench. The channel layer 224 of at least one of the through structures 114 is isolated from the string select line 2101 by the gate dielectric layer 122 of the at least one of the through structures 114. The channel layer 224 of at least one of the through structures 114 is isolated from the ground select line 2102 by the gate dielectric layer 122 of the at least one of the through structures 114. Other aspects, features, and details of the semiconductor structure shown in FIG. 2 are similar to those illustrated with respect to the semiconductor structure shown in FIG. 1.

Figure 3A:
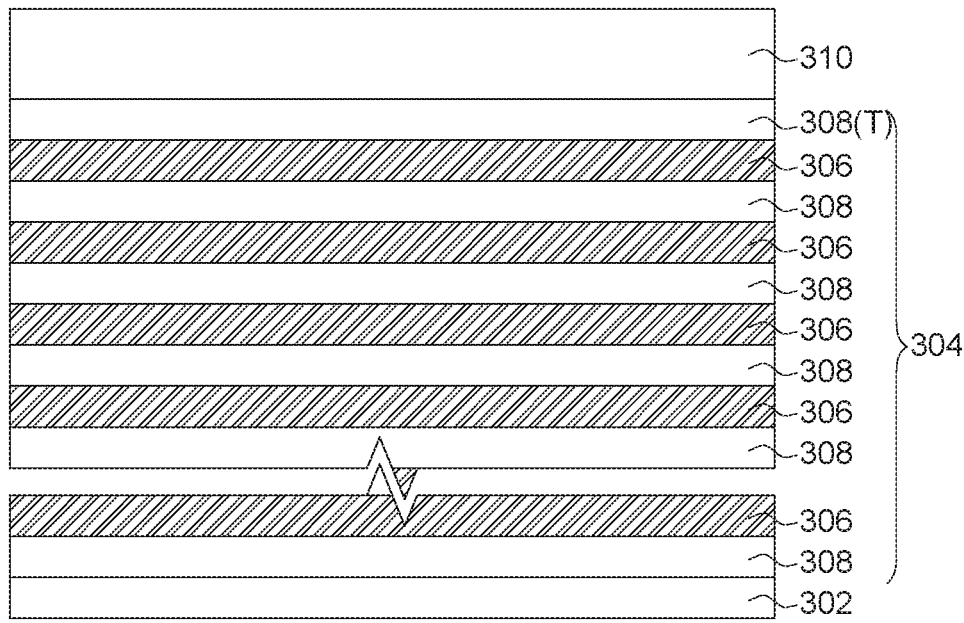
FIGS. 3A-3P show a method of manufacturing a semiconductor structure according to embodiments.

Now the detailed description is directed to methods of manufacturing said semiconductor structure. FIGS. 3A-3P show a method of manufacturing a semiconductor structure according to embodiments.

Figure 5A:
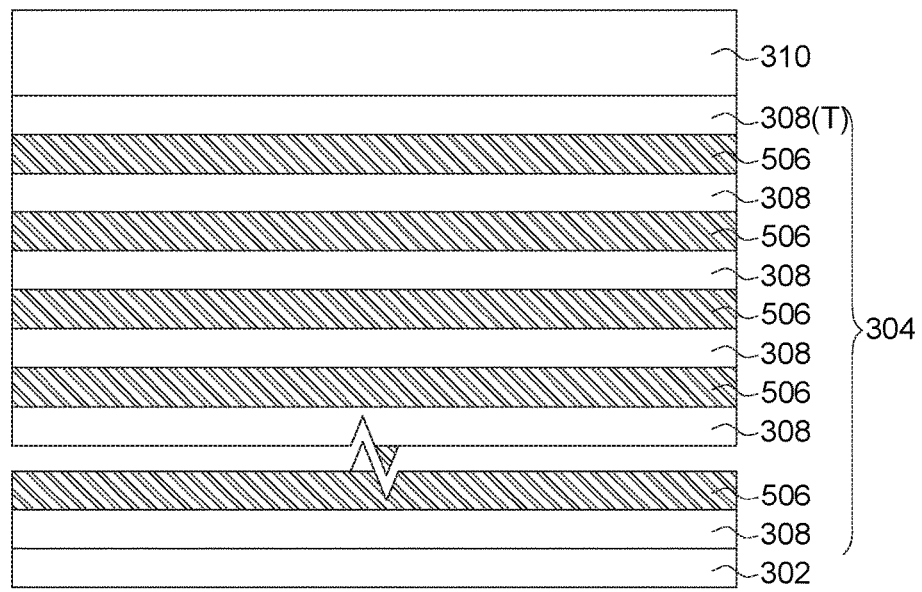
FIG. 5A is similar to FIG. 3A, but shows first layers as sacrificial layers.
Figure 5B:
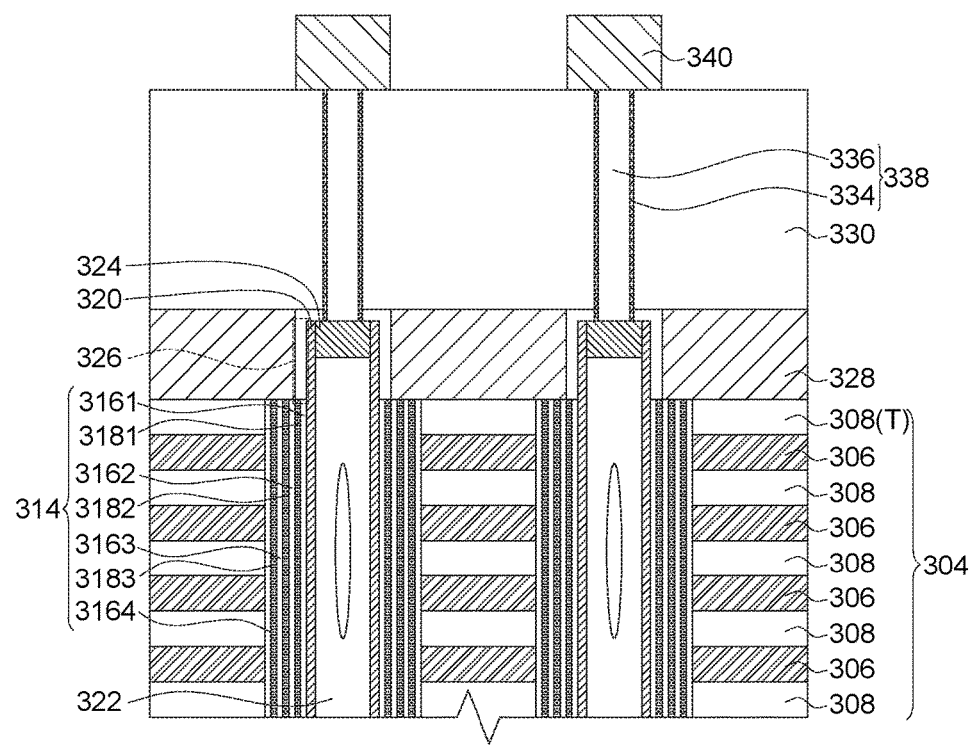
FIG. 5B shows the structure corresponding to FIG. 3P.

Referring to FIG. 3A, a substrate 302 is provided. A stack 304 is formed on the substrate 302. The stack 304 comprises a plurality of first layers 306 and a plurality of second layers 308, and the first layers 306 and the second layers 308 are alternately stacked. In some embodiments, the first layers 306 are first conductive layers, and the second layers 308 are first dielectric layers. The first conductive layers may be formed of heavily doped p-type polysilicon, and the first dielectric layers may be formed of oxide. In some embodiments, the first layers 506 are sacrificial layers, and the second layers 308 are first dielectric layers as shown in FIG. 5A. The sacrificial layers may be formed of nitride, and the first dielectric layers may be formed of oxide. Further, the sacrificial layers will be replaced by a conductive material in following steps, particular after the forming of said through structures. As such, as the structure shown in FIG. 5B, which corresponds to FIG. 3P, a plurality of first conductive layers (306) can be formed, wherein the first conductive layers (306) and the first dielectric layers (308) are alternately stacked. In this method, in the cases in which the second layers 308 are formed of oxide, a top second layer 308(T) is thicker than other second layers 308.

A hard mask 310 is formed on the stack 304. The hard mask 310 can be used as a stopping layer for a following chemical mechanical planarization (CMP) process. The hard mask 310 may be a layer formed of SiN. Alternatively, the hard mask 310 may comprise a SiN layer and an oxide layer. The SiN layer can prevent collapse or bending of a linear stack having a high aspect ratio. In this method, after the removal of the hard mask 310, the second conductive layer, which may comprise at least one string select line, may be formed in the same position of the hard mask 310. As such, the thickness of the hard mask 310 may depend on a desired characteristic of the string select line.

Figure 3B:
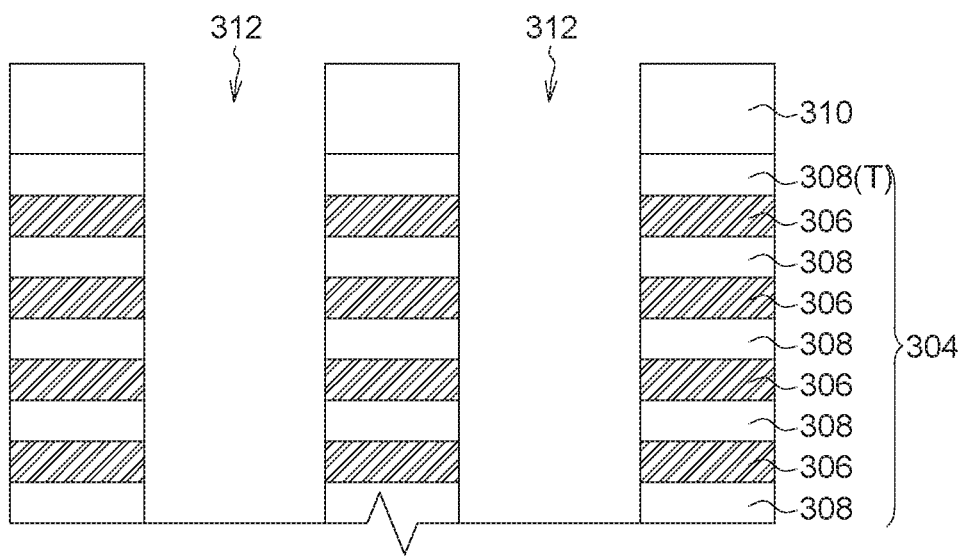

Referring to FIG. 3B, a plurality of openings 312 are formed through the hard mask 310 and the stack 304. More specifically, the substrate 302 may be exposed by the openings 312. The openings 312 may be holes, trenches, or the like. In the cases that the openings 312 are holes, the method can be applied to GAA memory structures. While in the cases that the openings 312 are trenches, the method can be applied to SGVC memory structures. Further, the method can be applied to bottom source type memory structures.

Thereafter, a plurality of memory layers 314 are formed on sidewalls of the openings 312, respectively. A plurality of channel layers 320 are formed on the memory layers 314, respectively. A dielectric material 322 is filled into the openings 312. A plurality of pads 324 are formed on the dielectric material 322 in the openings 312, respectively.

Figure 3C:
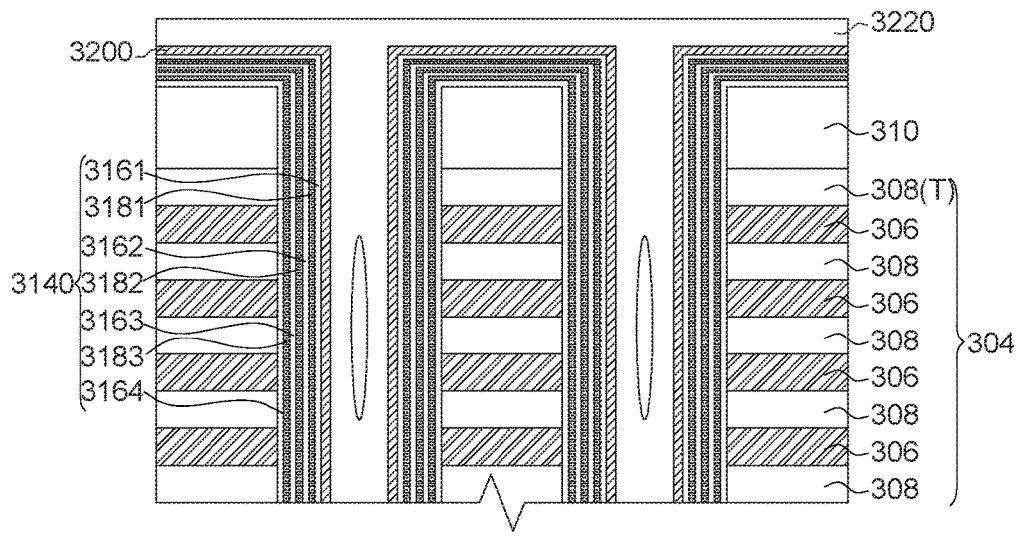

Referring to FIG. 3C, a memory layer 3140 is formed conformally on the hard mask 310 and into the openings 312. It can be conducted by a deposition process. The memory layer 3140 may have an ONO structure, an ONONO structure, an ONONONO structure, a SiON/SiN/oxide structure, or any one of other suitable tunneling-trapping-blocking structures. In FIG. 3C, the memory layer 3140 is illustrated having an ONONONO structure. That is, the memory layer 3140 comprises oxide layers 3161-3164 and nitride layers 3181-3183, wherein the oxide layer 3161, the nitride layer 3181 and the oxide layer 3162 constitute the tunneling structure, the nitride layer 3182 constitute the trapping structure, and the oxide layer 3163, the nitride layer 3183 and the oxide layer 3164 constitute the blocking structure. A channel layer 3200 is formed on the memory layer 3140. The channel layer 3200 may be formed of undoped polysilicon by deposition. Then, a dielectric material 3220 is formed on the channel layer 3200 and filled into the remaining spaces of the openings 312. It can be conducted by a deposition process. The dielectric material 3220 may be oxide. In some embodiments, voids or gaps may be formed within the dielectric material 3220, and be beneficial for decreasing the coupling rate of two adjacent channel layers.

Figure 3D:
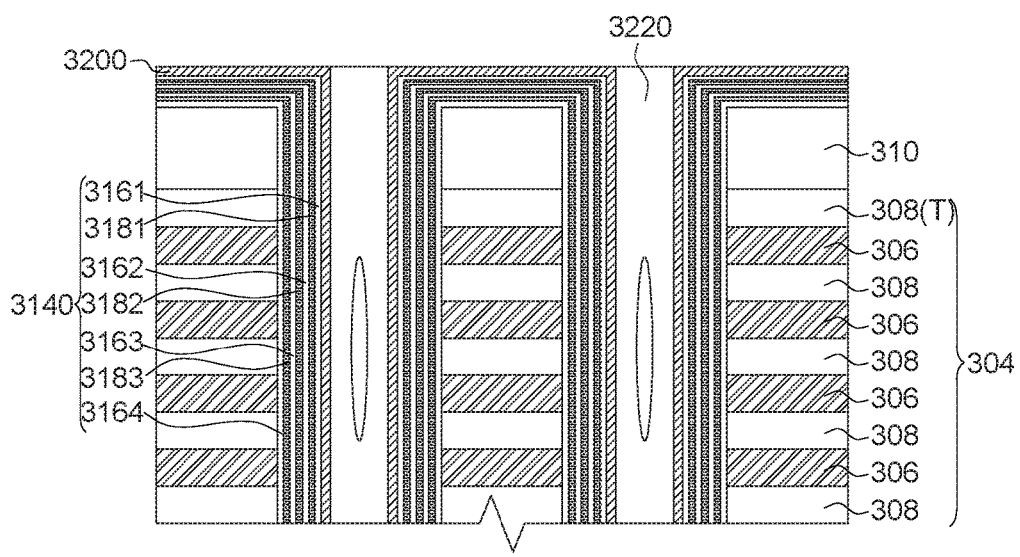
Figure 3E:
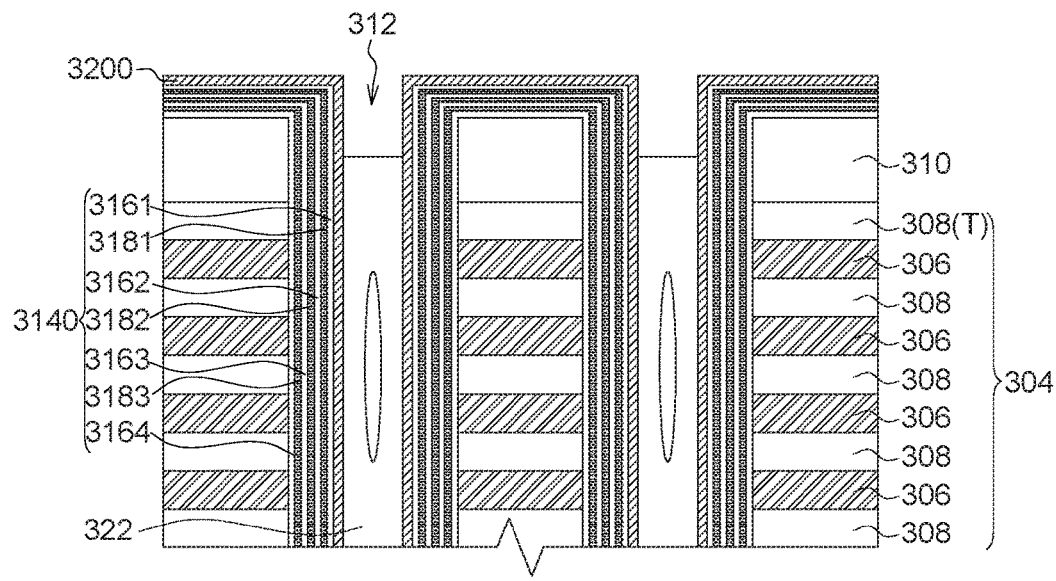

Referring to FIG. 3D, a planarization process, such as a CMP process, is conducted to remove the portion of the dielectric material 3220 on the channel layer 3200. Then, top portions of the dielectric material 3220 in the openings 312 are also removed, as shown in FIG. 3E. It can be conducted by a dip process using dilute hydrofluoric acid (DHF) or BOE etchant. The remaining dielectric material 322 in each of the openings 312 has a top surface at a level higher than a top surface of the stack 304. Further, the top surface of the dielectric material 322 may be at a level lower than the top surface of the hard mask 310.

Figure 3F:
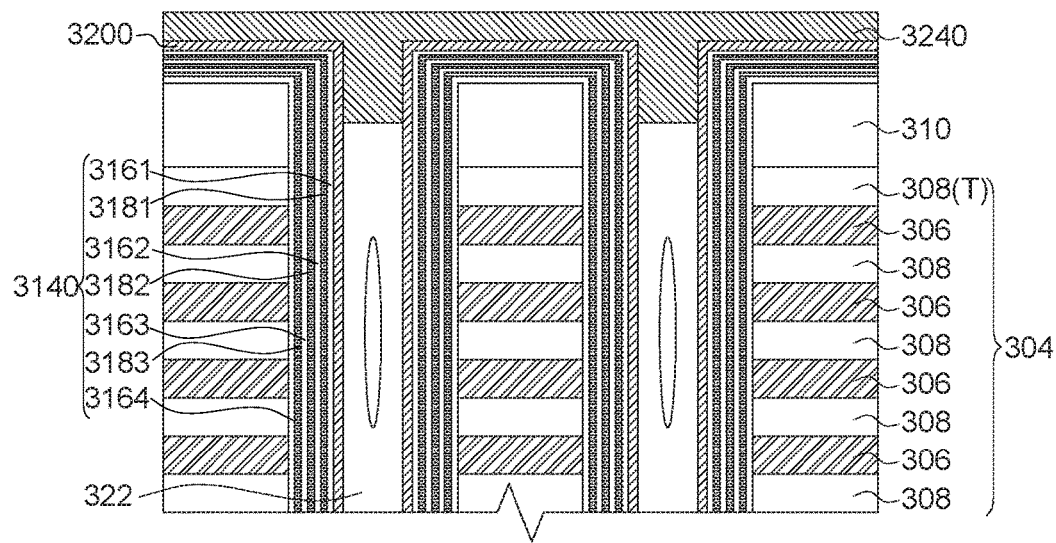
Figure 3G:
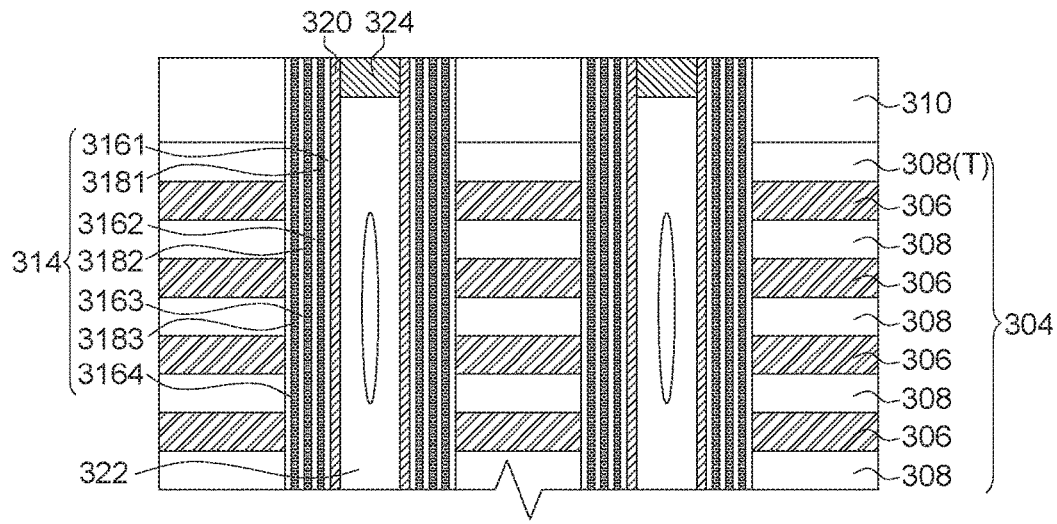

Referring to FIG. 3F, a conductive material 3240 is formed on the channel layer 3200 and filled into the remaining spaces of the openings 312, for example, by deposition. The conductive material 3240 may be heavily doped n-type polysilicon. Then, as shown in FIG. 3G, a planarization process, such as a CMP process, is conducted and stopped on the hard mask 310. As such, the memory layer 3140 is divided into a plurality of memory layers 314 formed on sidewalls of the openings 312, respectively. The channel layer 3200 is divided into a plurality of channel layers 320 formed on the memory layers 314, respectively. Further, a plurality of pads 324 are formed on the dielectric material 322 in the openings 312, respectively.

Thereafter, the hard mask 310 and portions of the memory layers 314 that extend beyond the stack 304 are removed. More specifically, the step of removing the portions of the memory layers 314 that extend beyond the stack 304 may comprise a nitride removing step and an oxide removing step, and the step of removing the hard mask 310 and the nitride removing step can be conducted simultaneously. However, the method is not limited thereto.

Figure 3H:
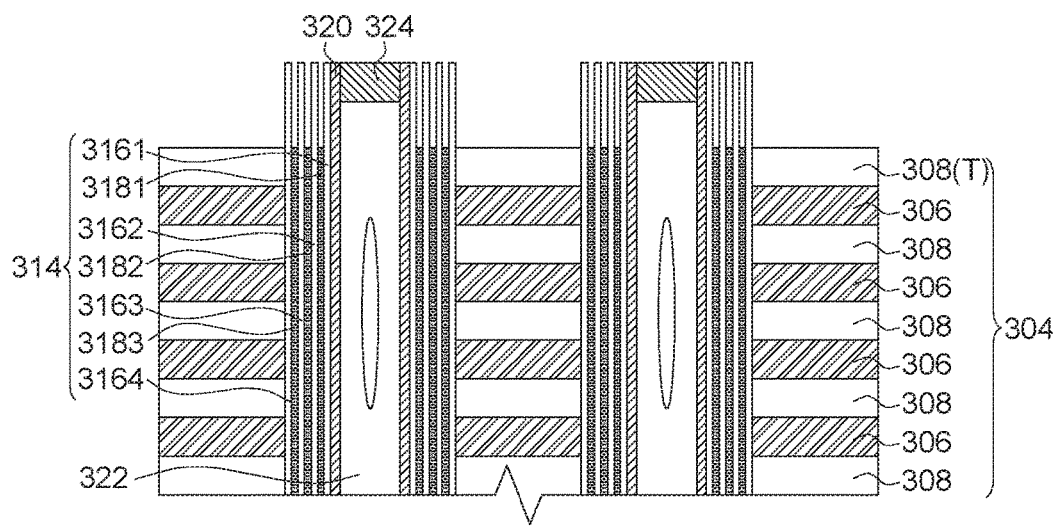

Referring to FIG. 3H, the nitride removing step is conducted, for example, by a dip process using $H_3PO_4$. Thereby, portions of the nitride layers 3181-3183 of the memory layers 314 that extend beyond the stack 304 can be removed. Further, the hard mask 310 formed of SiN can also be removed.

Figure 3I:
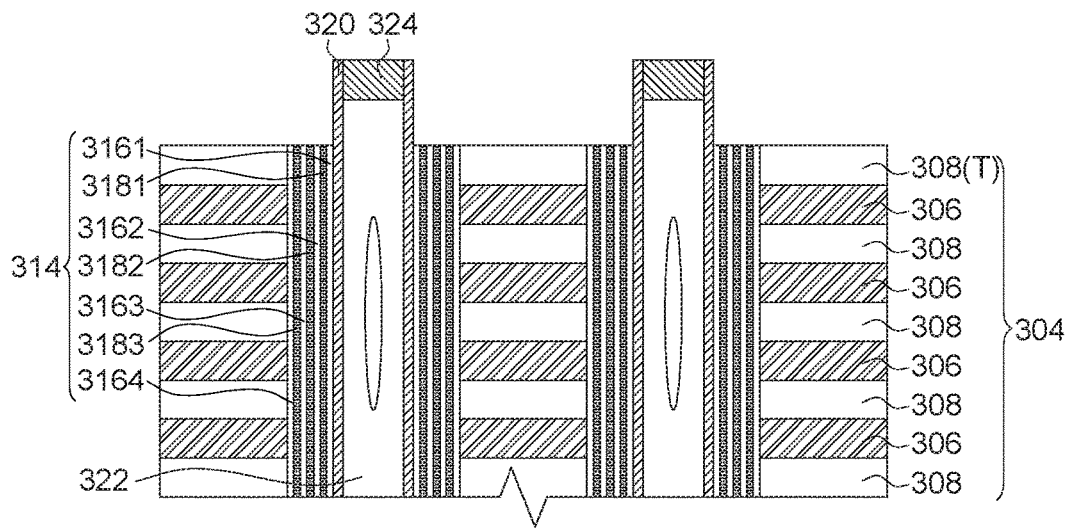

Referring to FIG. 3I, the oxide removing step is conducted, for example, by a dip process using DHF. Thereby, portions of the oxide layers 3161-3164 of the memory layers 314 that extend beyond the stack 304 can be removed. In the cases that the memory layers 314 comprise SiON layers, portions of the SiON layers that extend beyond the stack 304 can be partially removed during both the nitride removing step and the oxide removing step, and may be removed entirely after the two step are completed. According to some embodiments, for entirely damaging portions of the memory layers 314 that extend beyond the stack 304, the nitride removing step and the oxide removing step may be conducted alternately for several times. In some embodiments, the portions of the memory layers 314 that extend beyond the stack 304 are completely removed. Alternatively, a remaining nitride layer of the portions of the memory layers 314 that extend beyond the stack 304 has a thickness less than 30 Å, preferably less than or equal to 25 Å. For example, portions of the oxide layer 3161, the nitride layer 3181 and the oxide layer 3162, which do not trap charge, may be remained without departing the scope of the embodiments.

Figure 3J:
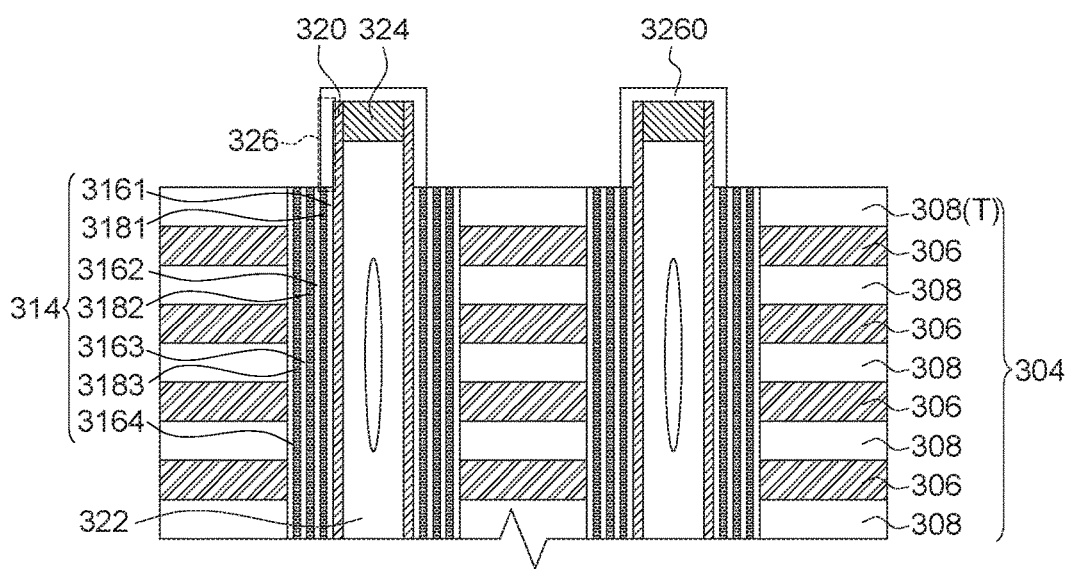

Thereafter, a plurality of gate dielectric layers 326 are formed on the channel layers 320, respectively. The gate dielectric layers may be formed by an oxidation process. For example, as shown in FIG. 3J, an oxidation process, such as a thermal oxidation process or an in situ steam generation (ISSG) oxidation process, of silicon materials can be conducted. As such, an oxide layer 3260 is formed conformal with portions of the channel layers 320 and pads 324 that are exposed by the stack 304. According to some embodiments, the oxide layer 3260 may has a thickness of about 70 Å to about 100 Å. Alternatively, a deposition process may be conducted, and an oxide layer is formed conformally on the whole structure. The portions of the oxide layer 3260 on the channel layers 320 are used as the gate dielectric layers 326. In some embodiments, the other portions of the oxide layer 3260, such as portions formed on the pads 324, may be removed.

Figure 3K:
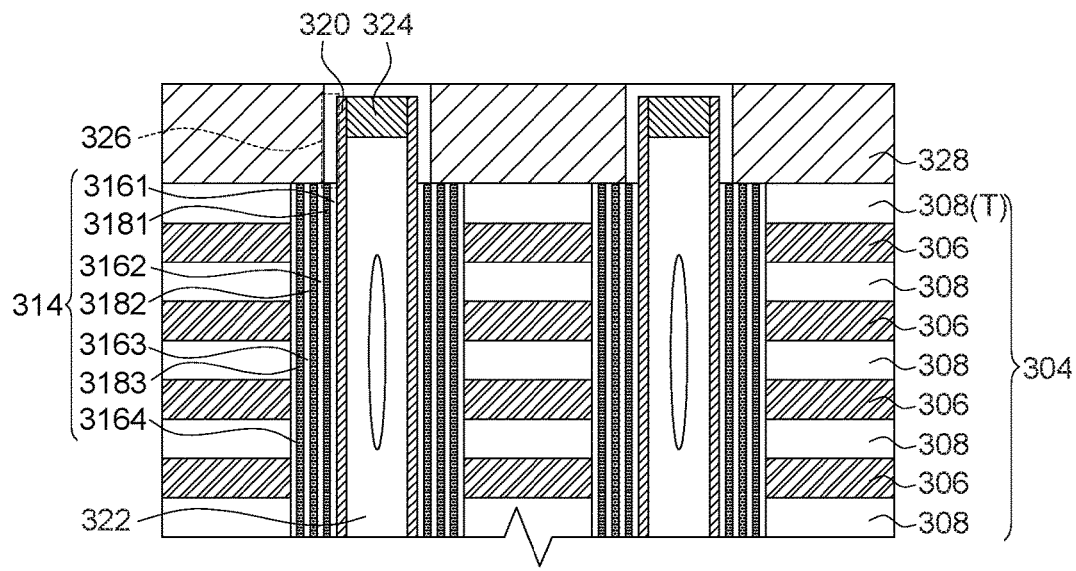

Referring to FIG. 3K, after forming the gate dielectric layers 326, a second conductive layer 328 is formed on the stack 304. As such, the channel layers 320 are isolated from the stack 304 by the memory layers 314, and the channel layers 320 are isolated from the second conductive layer 328 by the gate dielectric layers 326 having a different composition from the memory layers 314. According to some embodiments, the second conductive layer 328 may be formed of heavily doped p-type or n-type polysilicon, and preferably be formed of heavily doped n-type polysilicon.

For example, it can be conducted by a deposition process followed by a CMP process. Alternatively, metal may be used to form the second conductive layer 328. For example, the second conductive layer 328 may have a Ti/TiN/W structure. Further, in some embodiments, a salicide process for the second conductive layer 328 and the pads 324 may be conducted to reducing the resistance. The second conductive layer 328 may comprise a string select line/string select lines. The second conductive layer 328 may further comprise ground select lines.

Figure 3L:
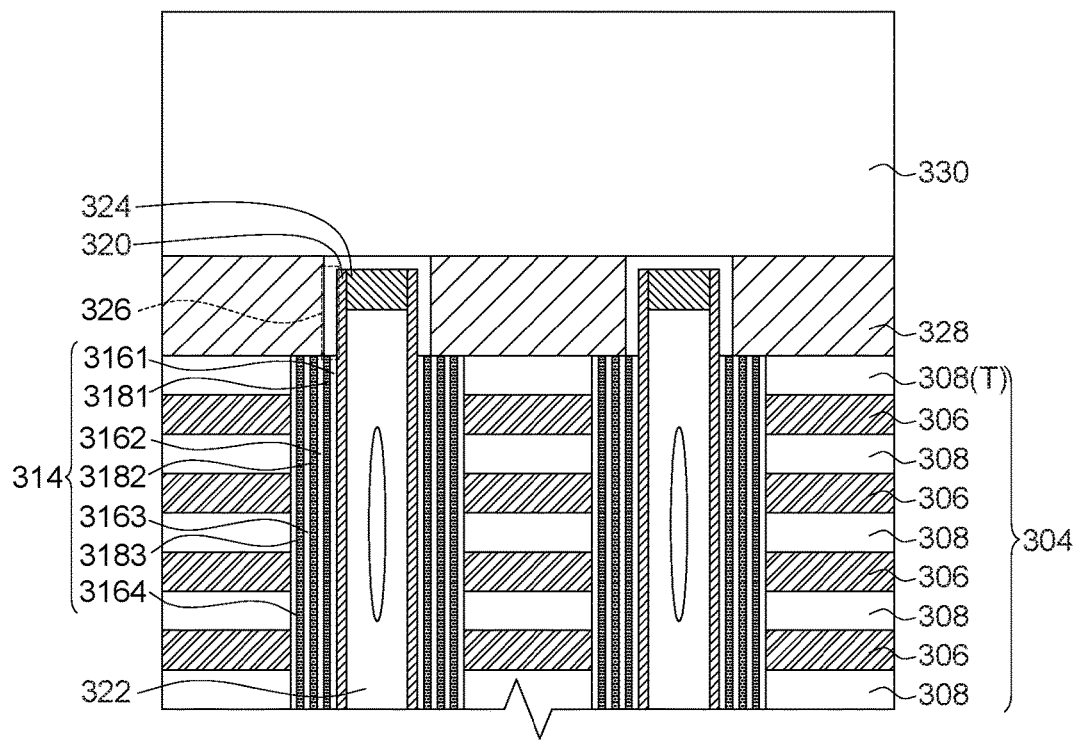
Figure 3M:
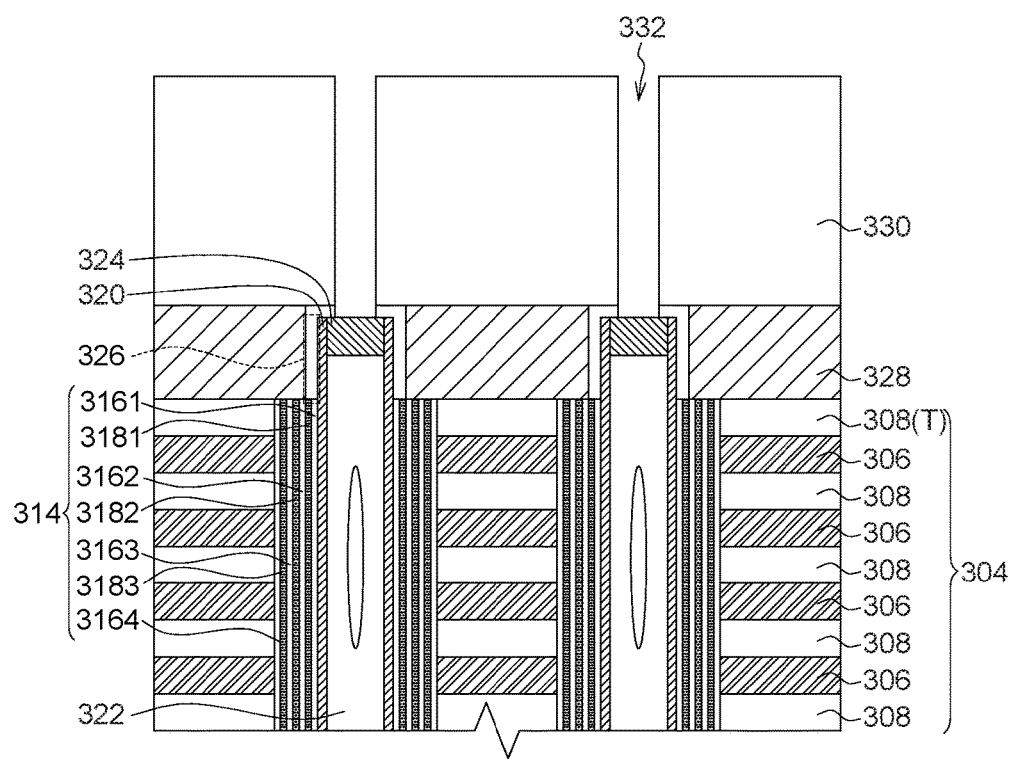
Figure 3N:
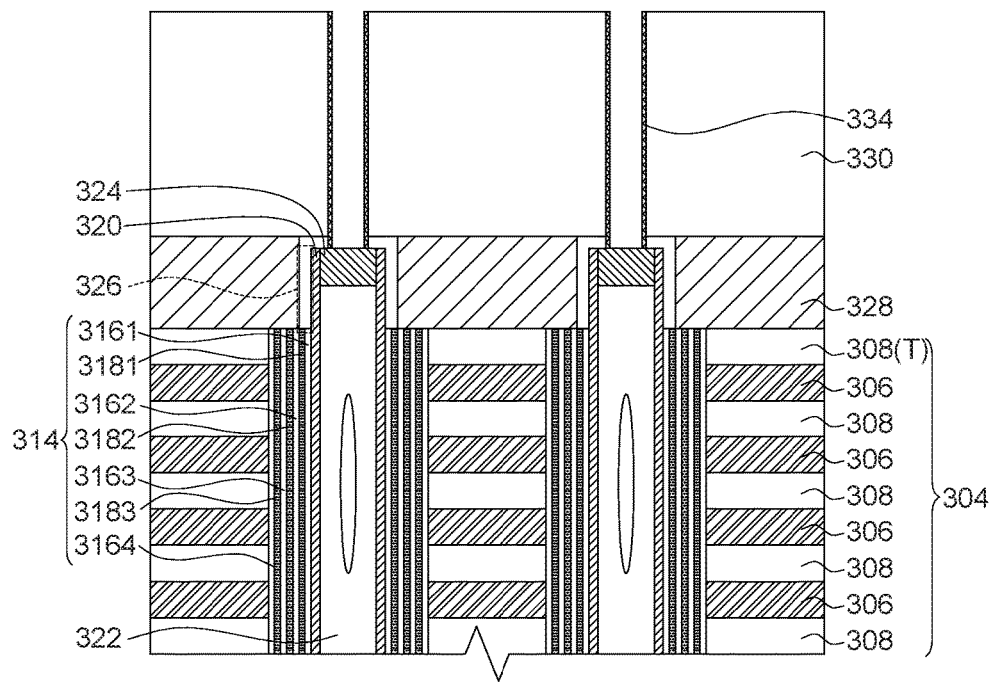
Figure 3O:
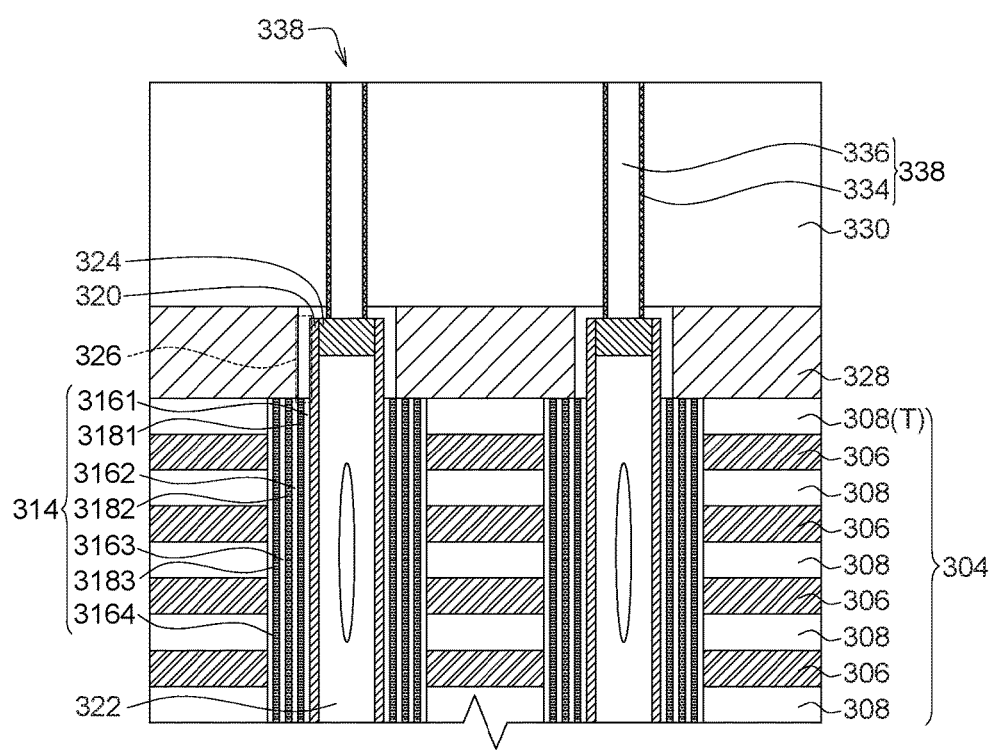
Figure 3P:
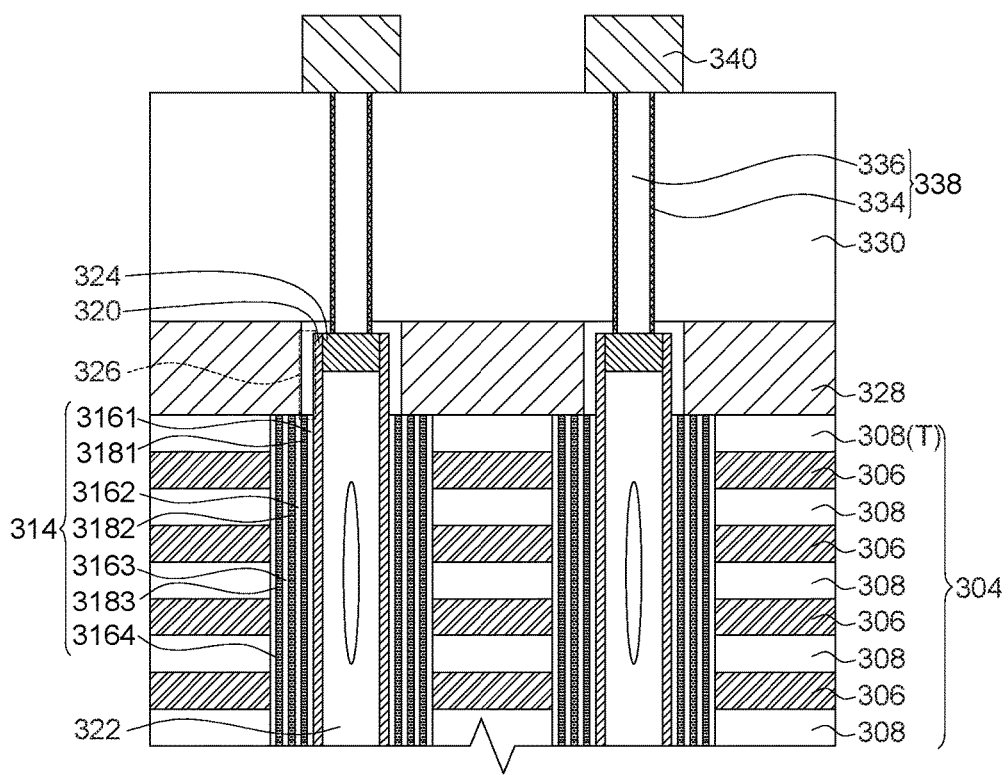

Thereafter, other typical processes for the method of manufacturing a semiconductor structure may be conducted. For example, referring to FIG. 3L, a second dielectric layer 330, which is used as an interlayer dielectric, may be formed on the second conductive layer 328 and the pads 324. It can be conducted by a deposition process followed by a CMP process. The second dielectric layer 330 may be formed of oxide. Then, as shown in FIG. 3M, a plurality of through holes 332 are formed corresponding to the pads 324. Referring to FIG. 3N, liners 334 are formed on sidewalls of the through holes 332, respectively. It can be conducted by a deposition process followed by an etching process. The liners 334 may be formed of oxide, SiN, or the like. Then, as shown in FIG. 3O, a conductive material 336 is filled into the through holes 332. It can be conducted by a chemical vapor deposition (CVD) process followed by a CMP process. The conductive material 336 may comprise Ti, TiN and W. As such, a plurality of connectors 338 comprising the liner 334 and the conductive material 336 are formed. They are used to provide an electrical connection between the pads 324 and a third conductive layer 340 formed in the following steps. Referring to FIG. 3P, the third conductive layer 340 is formed on the second dielectric layer 330. The third conductive layer 340 may be formed of metal. The third conductive layer 340 may comprise a plurality of bit lines. In such cases, the pads 324 may be bit line pads, and be connected to the bit lines by the connectors 338.

Figure 4A:
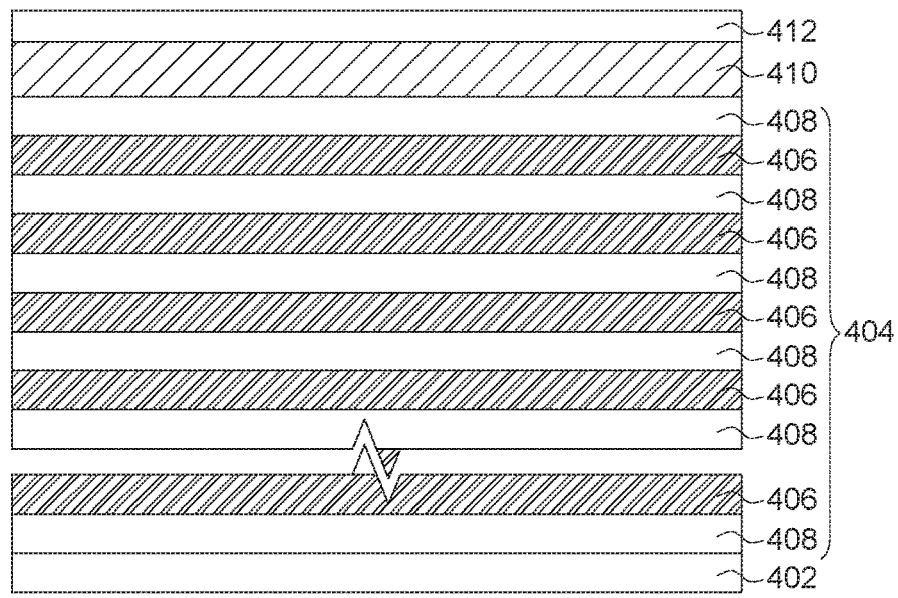
FIGS. 4A-4O show another method of manufacturing a semiconductor structure according to embodiments.
Figure 4B:
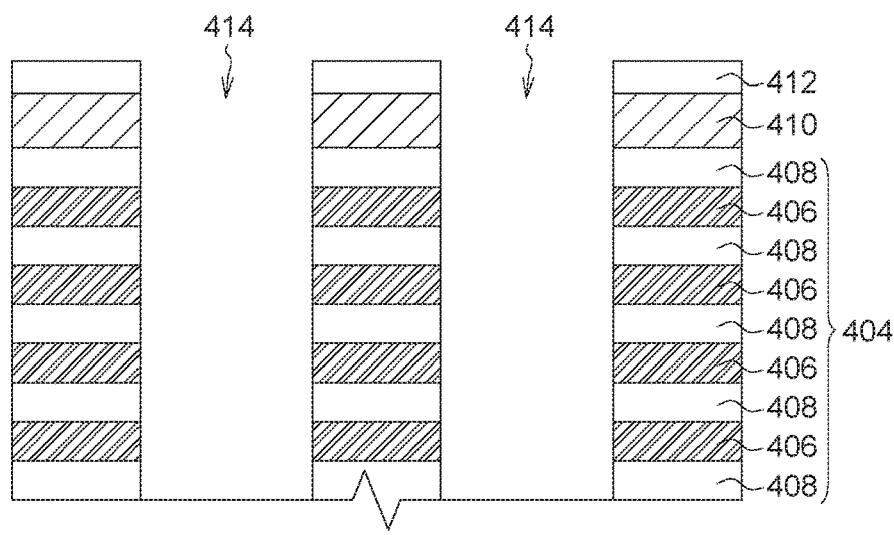
Figure 4C:
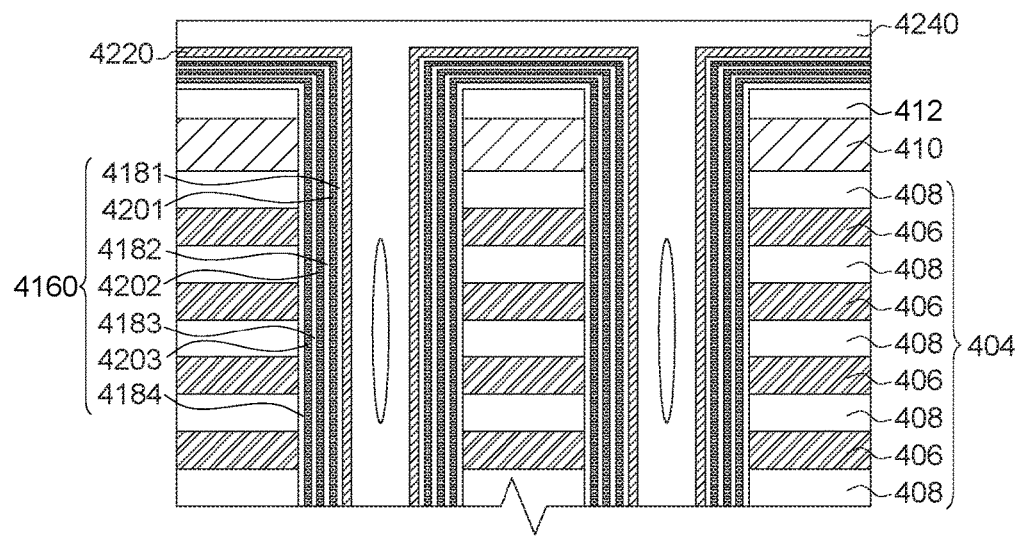
Figure 4D:
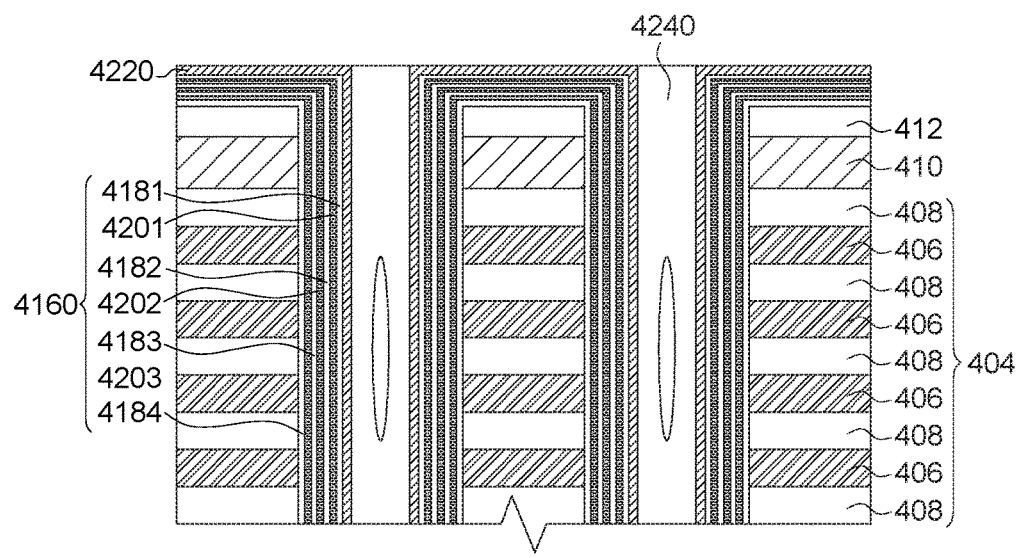
Figure 4E:
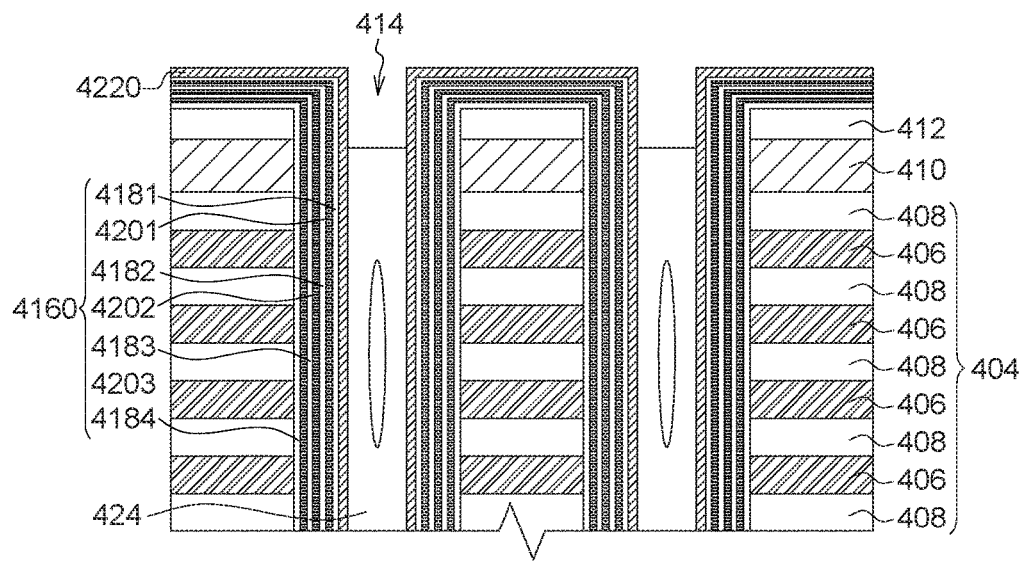
Figure 4F:
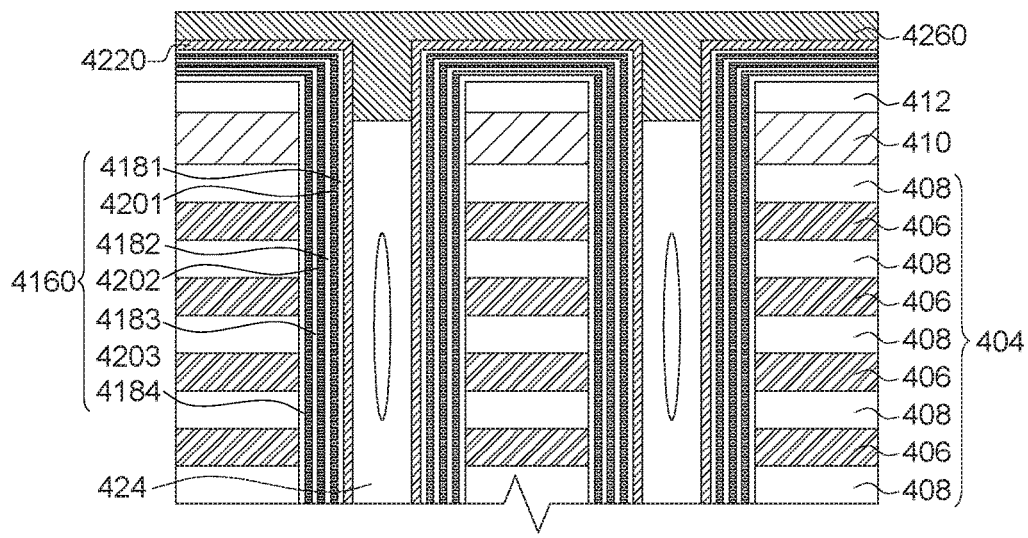
Figure 4G:
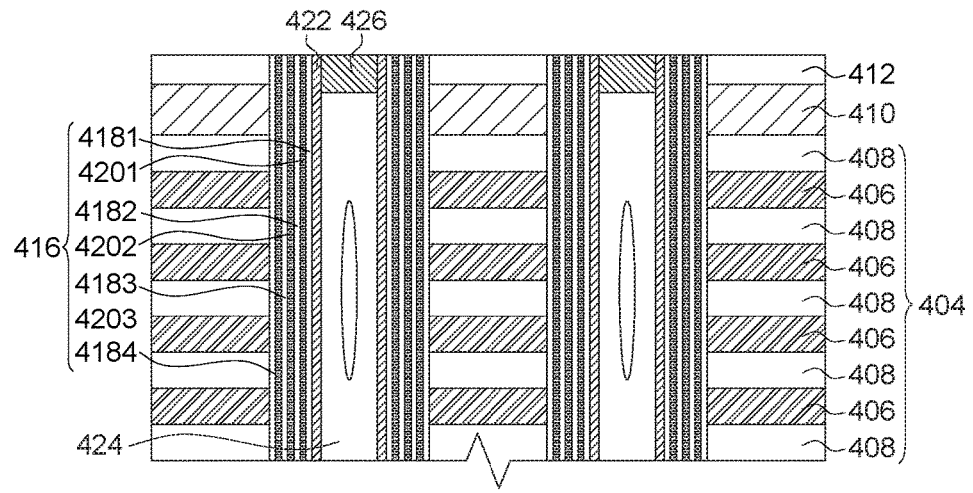
Figure 4H:
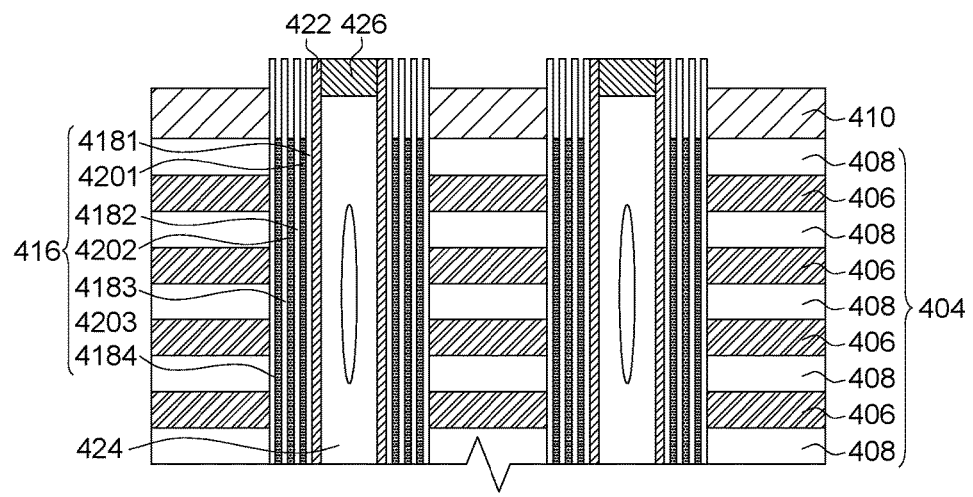
Figure 4I:
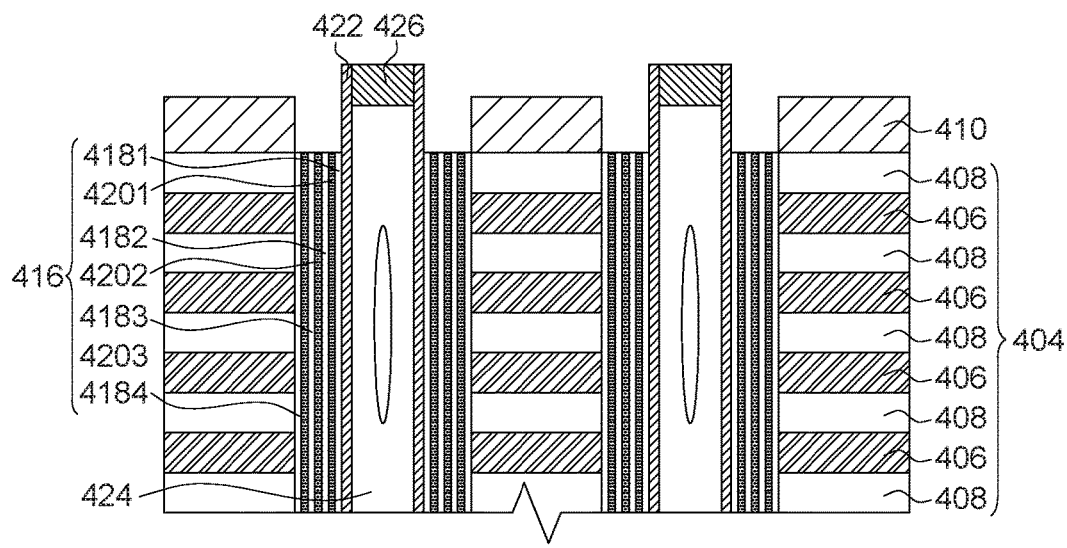
Figure 4J:
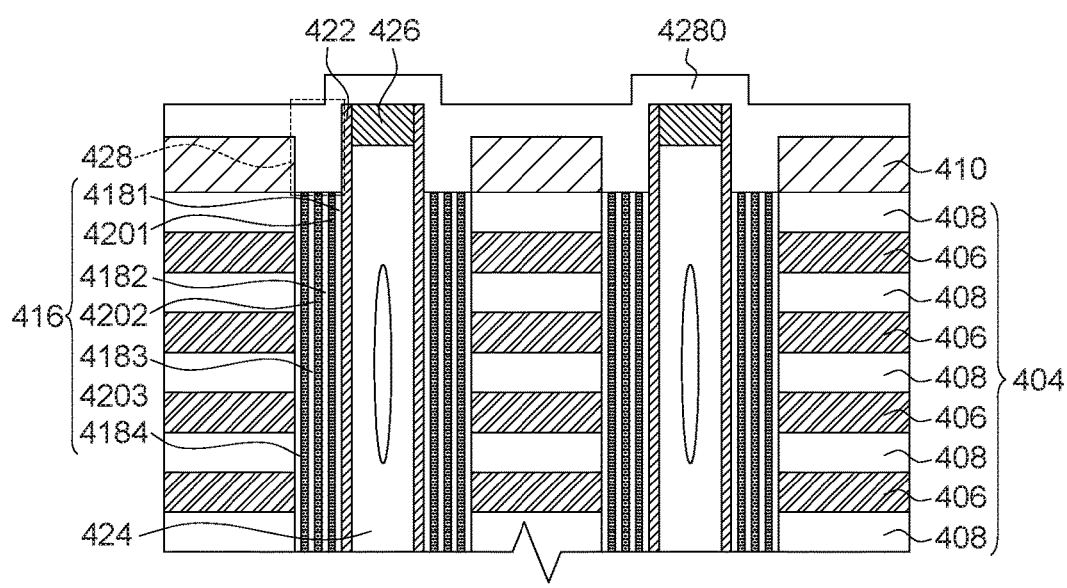
Figure 4K:
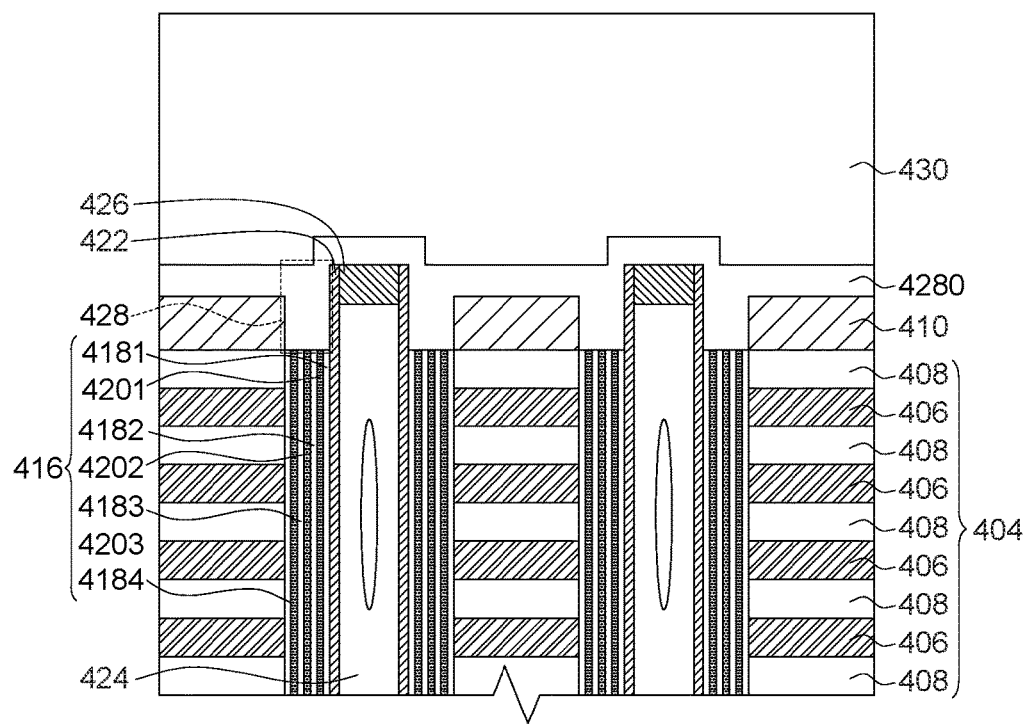
Figure 4L:
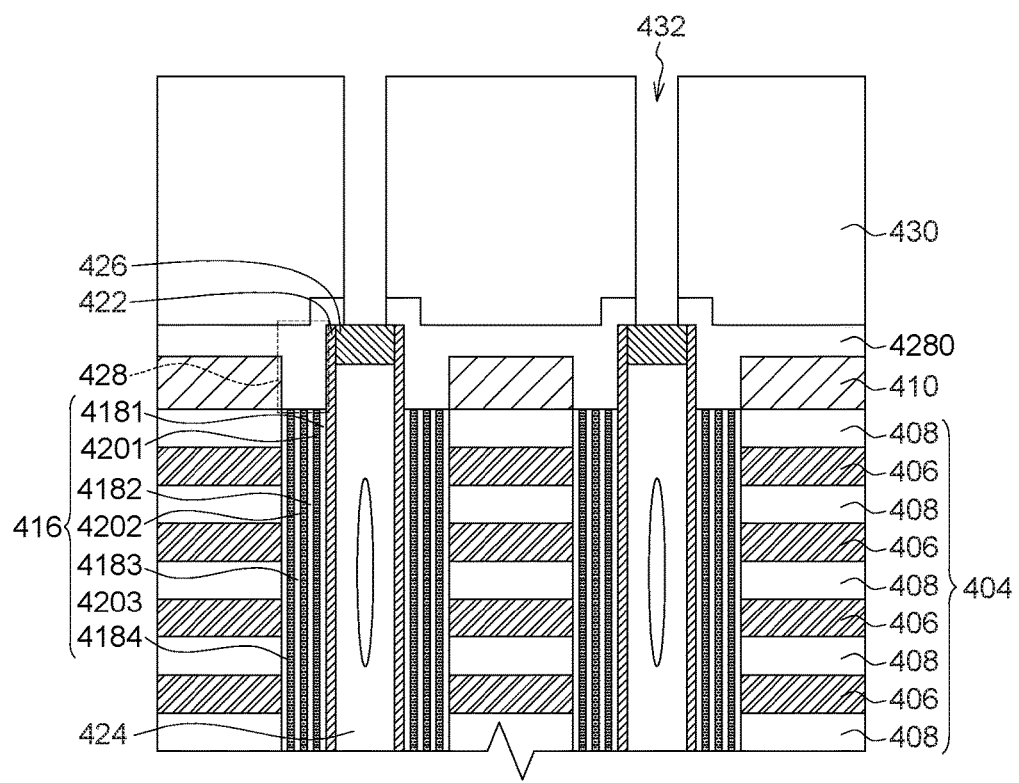
Figure 4M:
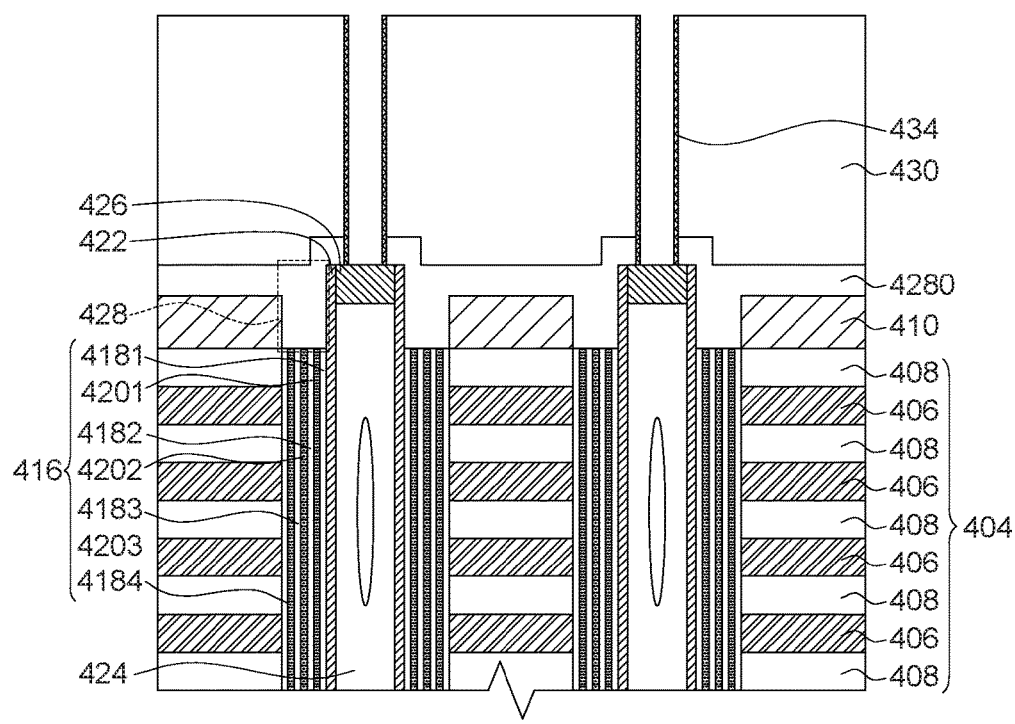
Figure 4N:
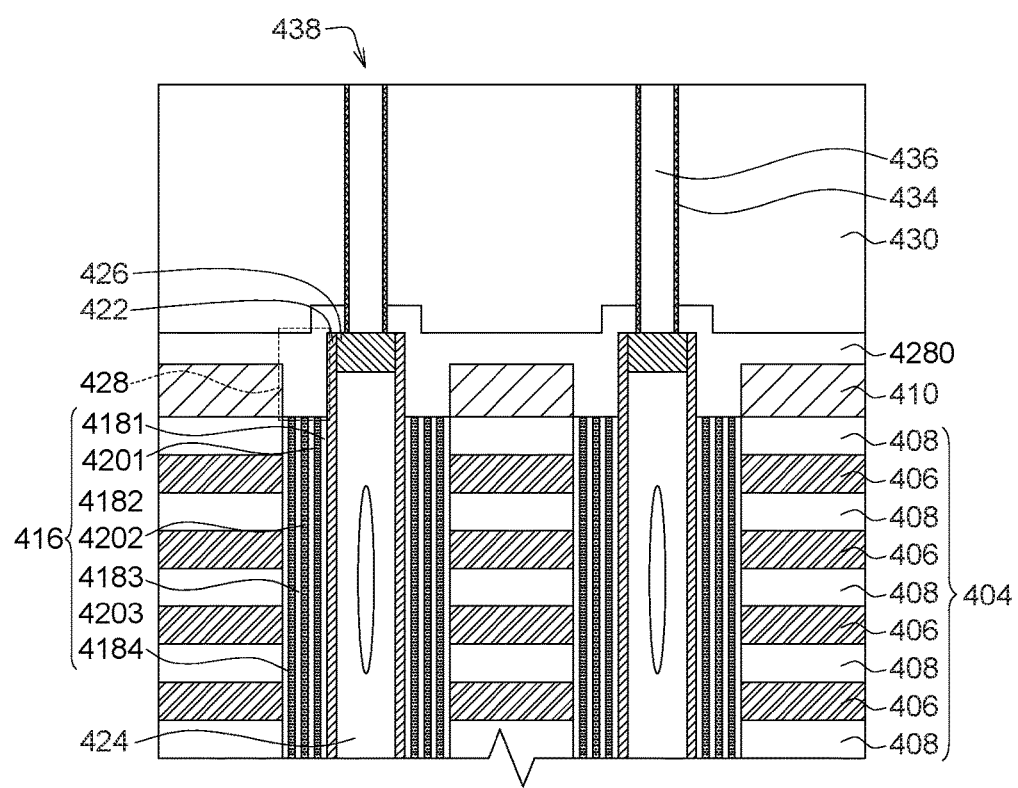
Figure 4O:
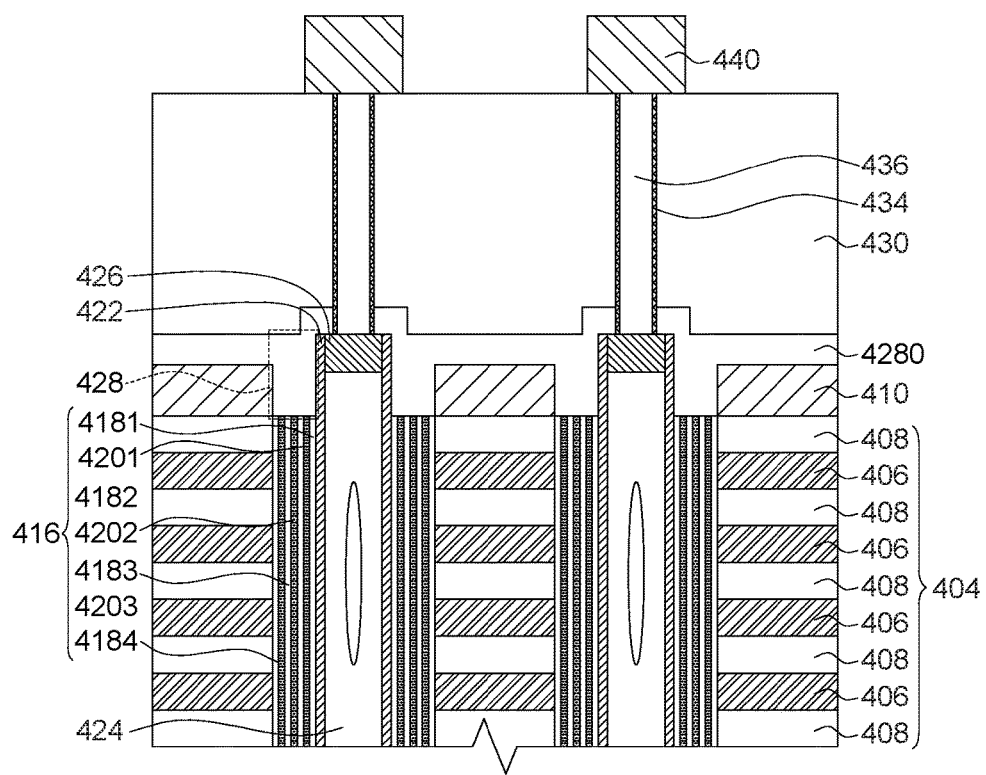

FIGS. 4A-4O show another method of manufacturing a semiconductor structure according to embodiments.

Referring to FIG. 4A, a substrate 402 is provided. A stack 404 is formed on the substrate 402. The stack 404 comprises a plurality of first layers 406 and a plurality of second layers 408, and the first layers 406 and the second layers 408 are alternately stacked. In some embodiments, the first layers 406 are first conductive layers, and the second layers 408 are first dielectric layers. The first conductive layers may be formed of heavily doped p-type polysilicon, and the first dielectric layers may be formed of oxide. In some embodiments, the first layers 406 are sacrificial layers, and the second layers 408 are first dielectric layers. The sacrificial layers may be formed of nitride, and the first dielectric layers may be formed of oxide. Further, the sacrificial layers will be replaced by a conductive material in following steps, particular after the forming of said through structures. As such, a plurality of first conductive layers can be formed, wherein the first conductive layers and the first dielectric layers are alternately stacked.

Then, a second conductive layer 410 is formed on the stack 404. The second conductive layer 410 may be formed of heavily doped p-type or n-type polysilicon, and preferably be formed of heavily doped n-type polysilicon. The second conductive layer 328 can be used to provide string select lines, and optional ground select lines.

After the formation of the second conductive layer 410, a hard mask 412 is formed on the second conductive layer 410. The hard mask 412 can be used as a stopping layer for a following CMP process. The hard mask 412 may be a layer formed of SiN. Alternatively, the hard mask 412 may comprise a SiN layer and an oxide layer. The SiN layer can prevent collapse or bending of a linear stack having a high aspect ratio.

Referring to FIG. 4B, a plurality of openings 414 are formed through the hard mask 412, the second conductive layer 410 and the stack 404. More specifically, the substrate 402 may be exposed by the openings 414. The openings 414 may be holes, trenches, or the like. In the cases that the openings 414 are holes, the method can be applied to GAA memory structures. While in the cases that the openings 414 are trenches, the method can be applied to SGVC memory structures. Further, the method can be applied to bottom source type memory structures.

Thereafter, a plurality of memory layers 416 are formed on sidewalls of the openings 414, respectively. A plurality of channel layers 422 are formed on the memory layers 416, respectively. A dielectric material 424 is filled into the openings 414. A plurality of pads 426 are formed on the dielectric material 424 in the openings 414, respectively.

Referring to FIG. 4C, a memory layer 4160 is formed conformally on the hard mask 412 and into the openings 414. It can be conducted by a deposition process. The memory layer 4160 may have an ONO structure, an ONONO structure, an ONONONO structure, a SiON/SiN/oxide structure, or any one of other suitable tunneling-trapping-blocking structures. In FIG. 4C, the memory layer 4160 is illustrated having an ONONONO structure. That is, the memory layer 4160 comprises oxide layers 4181-4184 and nitride layers 4201-4203, wherein the oxide layer 4181, the nitride layer 4201 and the oxide layer 4182 constitute the tunneling structure, the nitride layer 4202 constitute the trapping structure, and the oxide layer 4183, the nitride layer 4203 and the oxide layer 4184 constitute the blocking structure. In some embodiments, such as those applied to bottom source type memory structures, portions of the memory layer 4160 formed on bottoms of the openings 414 are removed, and the substrate 402 is exposed. Then, a channel layer 4220 is formed on the memory layer 4160. The channel layer 4220 may be formed of undoped polysilicon by deposition. Then, a dielectric material 4240 is formed on the channel layer 4220 and filled into the remaining spaces of the openings 414. It can be conducted by a deposition process. The dielectric material 4240 may be oxide. In some embodiments, voids or gaps may be formed within the dielectric material 4240, and be beneficial for decreasing the coupling rate of two adjacent channel layers.

Referring to FIG. 4D, a planarization process, such as a CMP process, is conducted to remove the portion of the dielectric material 4240 on the channel layer 4220. Then, top portions of the dielectric material 4240 in the openings 414 are also removed, as shown in FIG. 4E. It can be conducted by a dip process using DHF or BOE etchant. The remaining dielectric material 424 in each of the openings 414 has a top surface at a level higher than a top surface of the stack 404. Further, the top surface of the dielectric material 424 may be at a level lower than the top surface of the second conductive layer 410.

Referring to FIG. 4F, a conductive material 4260 is formed on the channel layer 4220 and filled into the remaining spaces of the openings 414, for example, by deposition. The conductive material 4260 may be heavily doped n-type polysilicon. Then, as shown in FIG. 4G, a planarization process, such as a CMP process, is conducted and stopped on the hard mask 412. As such, the memory layer 4160 is divided into a plurality of memory layers 416 formed on sidewalls of the openings 414, respectively. The channel layer 4220 is divided into a plurality of channel layers 422 formed on the memory layers 416, respectively. Further, a plurality of pads 426 are formed on the dielectric material 424 in the openings 414, respectively.

Thereafter, the hard mask 412 and portions of the memory layers 416 that extend beyond the stack 404 are removed. More specifically, the step of removing the portions of the memory layers 416 that extend beyond the stack 404 may comprise a nitride removing step and an oxide removing step, and the step of removing the hard mask 412 and the nitride removing step can be conducted simultaneously. However, the method is not limited thereto.

Referring to FIG. 4H, the nitride removing step is conducted, for example, by a dip process using $H_3PO_4$. Thereby, portions of the nitride layers 4201-4203 of the memory layers 416 that extend beyond the stack 404 can be removed. Further, the hard mask 412 formed of SiN can also be removed.

Referring to FIG. 4I, the oxide removing step is conducted, for example, by a dip process using DHF. Thereby, portions of the oxide layers 4181-4184 of the memory layers 416 that extend beyond the stack 404 can be removed. In the cases that the memory layers 416 comprise SiON layers, portions of the SiON layers that extend beyond the stack 404 can be partially removed during both the nitride removing step and the oxide removing step, and may be removed entirely after the two step are completed. According to some embodiments, for entirely damaging portions of the memory layers 416 that extend beyond the stack 404, the nitride removing step and the oxide removing step may be conducted alternately for several times. In some embodiments, the portions of the memory layers 416 that extend beyond the stack 404 are completely removed. Alternatively, a remaining nitride layer of the portions of the memory layers 416 that extend beyond the stack 404 has a thickness less than 30 Å, preferably less than or equal to 25 Å. For example, portions of the oxide layer 4181, the nitride layer 4201 and the oxide layer 4182, which do not trap charge, may be remained without departing the scope of the embodiments.

Thereafter, a plurality of gate dielectric layers 428 are formed on the channel layers 422, respectively. It can be conducted by an oxidation process, such as a thermal oxidation process or an ISSG oxidation process, followed by a deposition process. As such, an oxide layer 4280 is formed conformally on the whole structure, as shown in FIG. 4J. The oxide layer formed by the oxidation process may has a thickness of about 70 Å, and provide a better quality for the gate dielectric layers 428. However, the oxide layer 4280 may be formed by only the deposition process. The portions of the oxide layer 4280 on the channel layers 422 are used as the gate dielectric layers 428. In some embodiments, the other portions of the oxide layer 4280 may be removed.

Since the memory layers 416 and the gate dielectric layers 428 have different compositions, the channel layers 422 can be isolated from the stack 404 and the second conductive layer 410 by different means.

Thereafter, other typical processes for the method of manufacturing a semiconductor structure may be conducted. For example, referring to FIG. 4K, a second dielectric layer 430, which is used as an interlayer dielectric, may be formed on the second conductive layer 410 and the pads 426. It can be conducted by a deposition process followed by a CMP process. The second dielectric layer 430 may be formed of oxide. Then, as shown in. 4L, a plurality of through holes 432 are formed corresponding to the pads 426. Referring to FIG. 4M, liners 434 are formed on sidewalls of the through holes 432, respectively. It can be conducted by a deposition process followed by an etching process. The liners 434 may be formed of oxide, SiN, or the like. Then, as shown in FIG. 4N, a conductive material 436 is filled into the through holes 432. It can be conducted by a CVD process followed by a CMP process. The conductive material 436 may comprise Ti, TiN and W. As such, a plurality of connectors 438 comprising the liner 434 and the conductive material 436 are formed. They are used to provide an electrical connection between the pads 426 and a third conductive layer 440 formed in the following steps. Referring to FIG. 4O, the third conductive layer 440 is formed on the second dielectric layer 430. The third conductive layer 440 may be formed of metal. The third conductive layer 440 may comprise a plurality of bit lines. In such cases, the pads 426 may be bit line pads, and be connected to the bit lines by the connectors 438.

In summary, according to embodiments, two means can be provided for separating the channel layers from the word lines and separating the channel layer from the string select lines. As such, the control of the string select line will not be disadvantageously affected, for example, by the control of memory cells. Thus, an extra circuitry is unneeded to control program/erase of the gate dielectric layer for the string select line.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a substrate; a stack formed on the substrate, wherein the stack comprises a plurality 5 of first conductive layers and a plurality of first dielectric layers, and the first conductive layers and the first dielectric layers are alternately stacked; a second conductive layer formed on the stack; a plurality of openings through the second conductive layer and the stack; and a plurality of through structures formed in the openings, respectively, wherein each of the through structures comprises: a memory layer and a gate dielectric layer formed on a sidewall of each of the openings; a channel layer formed on the memory layer and the gate dielectric layer, the channel layer defining a space; and a dielectric material and a pad formed in the space defined by the channel layer, wherein the pad is above the dielectric material; wherein the channel layer is isolated from the stack by the memory layer, the channel layer is isolated from the second conductive layer by the gate dielectric layer, and the memory layer and the gate dielectric layer have different compositions, wherein the gate dielectric layer is above the memory layer.

2. The semiconductor structure according to claim 1, wherein the openings are holes.

3. The semiconductor structure according to claim 1, wherein the openings are trenches.

4. The semiconductor structure according to claim 1, wherein a top surface of the dielectric material of each of the through structures is at a level higher than a top surface of the stack.

5. The semiconductor structure according to claim 1, wherein the channel layer of each of the through structures is isolated from the second conductive layer by only the gate dielectric layer of each of the through structures.

6. The semiconductor structure according to claim 1, wherein the second conductive layer comprises a string select line, and the channel layer of at least one of the through structures is isolated from the string select line by the gate dielectric layer of the at least one of the through structures.

7. The semiconductor structure according to claim 1, wherein the second conductive layer comprises a ground select line, and the channel layer of at least one of the through structures is isolated from the ground select line by the gate dielectric layer of the at least one of the through structures.

8. The semiconductor structure according to claim 1, wherein the memory layer of each of the through structures has an ONO structure, an ONONO structure, an ONON-ONO structure or a SiON/SiN/oxide structure, and the gate dielectric layer of each of the through structures is a layer formed of oxide, and wherein the gate dielectric layer of each of the through structures is above the memory layer of each of the through structures.

* * * * *